United States Patent [19]

Hirota

[11] Patent Number: 5,616,511
[45] Date of Patent: Apr. 1, 1997

[54] METHOD OF FABRICATING A MICRO-TRENCH STORAGE CAPACITOR

[75] Inventor: Toshiyuki Hirota, Tokyo, Japan

[73] Assignee: NEC Corporation, Tokyo, Japan

[21] Appl. No.: 280,933

[22] Filed: Jul. 27, 1994

[30] Foreign Application Priority Data

Jul. 27, 1993 [JP] Japan .................................. 5-184557

[51] Int. Cl.[6] .............................. H01L 21/70; H01L 27/00
[52] U.S. Cl. ......................... 438/396; 438/398; 438/705; 438/700
[58] Field of Search ................................ 437/47, 60, 52, 437/919, 977; 148/DIG. 3

[56] References Cited

U.S. PATENT DOCUMENTS 5,302,540  4/1994  Ko et al. .................................. 437/47
5,342,800  8/1994  Jun ............................................ 437/52

FOREIGN PATENT DOCUMENTS 1-119049  5/1989  Japan .................................... 437/946
4-196435  7/1992  Japan .

OTHER PUBLICATIONS

By N. Inoue et al., "The Selective Growth of LPCVCD–Si$_3$N$_4$ on Cleaned Si Surface", 1992, pp. 205–207.

By J. Yugami et al., "Inter–Poly SiO$_2$/Si$_3$N$_4$ Capacitor Films 5nm Thick for Deep Submicron LSIs", 1988, pp. 173–176.

By K. Ando et al, "Ultrathin silicon nitride films prepared by combining rapid thermal nitridation with low–pressure chemical vapor deposition", Applied Physic Letters, Aug. 26, 1991, vol. 59, No. 9, pp. 1081–1083.

By S. Kim et al., "Characteristics of the NO Dielectric Film in the MTS (Micro–Trench Storage) Capacitor Structure", 1992, vol. 12, No. 11, pp. 126–131.

Primary Examiner—Jey Tsai
Attorney, Agent, or Firm—Young & Thompson

[57] ABSTRACT

There is provided a method of fabricating a storage capacitor. A bottom semiconductor film having an electrical conductivity is formed for subsequent formation of a phase splitting glass film on the bottom semiconductor film. The phase splitting glass film is subjected to a heat treatment to allow the phase splitting glass film to be split into at least two different glass films which have different components. The phase splitting glass film is subjected to an etching in which one of the glass films has a higher etching rate than an etching rate of another of the glass films so that only the glass film having the higher etching rate is removed, while the other glass film remains thereby a mask pattern including the remaining other glass film is formed. The bottom semiconductor film is subjected to a dry etching using the mask to form trench grooves defined by trench pillars in the bottom semiconductor film. A dielectric film is formed on surfaces of the trench grooves and trench pillars. A top semiconductor film having an electrical conductivity is formed on the dielectric film.

26 Claims, 3 Drawing Sheets

METHOD OF FABRICATING A MICRO-TRENCH STORAGE CAPACITOR

BACKGROUND OF THE INVENTION

The invention relates to a method of fabricating a semiconductor device, and more particularly to a method of fabricating a micro-trench storage capacitor.

Recently, requirement for improvement in a high density integration of large scale integrated circuits has been on the increase thereby a minimization in size of each element constituting the large scale integrated circuits is also required. The large scale integrated circuits generally includes dynamic random access memories involving may capacitors. To obtain a further improvement in a high density integration of the large scale integrated circuit, a further minimization in size of the storage capacitors constituting memory devices is required.

On the other hand, the storage capacitor is of course required to have a necessary capacity. As well known, the capacity of the capacitor depends upon a contact area between electrode and dielectric film constituting the capacitor. A large contact area between the electrode and the dielectric film provides the capacitor with a large capacity.

To realize a further improvement in a high density in integration of the large scale integrated circuits involving the storage capacitors, each of the storage capacitor is required to have a possible small occupied area and a possible large contact surface between electrode and dielectric film involved in the capacitor. For that purpose, various structures of the capacitor has been proposed.

One of conventional structures of the capacitors is disclosed in the Japanese laid-open patent application No. 4-196435 in which a hemispheric grain polysilicon is used as a bottom electrode to allow the capacitor to have a large storage capacitor in a limited small occupied area.

Another of the conventional structures of the capacitors is disclosed in 1992 December, Proceeding of the 43rd Symposium on Semiconductors and Integrated Circuits Technology, pp. 126–131 in which a micro-trench storage capacitor was proposed. Fabrication processes of this conventional capacitor will be described in detail with reference to FIGS. 1A to 1C.

With reference to FIG. 1A, an isolation silicon oxide film 20 is formed on a surface of a silicon substrate 1. A silicon nitride film is deposited on a surface of the isolation oxide film 20 by use of a chemical vapor deposition method. A silicon oxide film 22 is further deposited on a surface of the silicon nitride film 21 by use of a chemical vapor deposition method. A contact hole is formed by use of both lithography and etching to penetrate through the triplet films or the silicon oxide film 22, the silicon nitride film 21 and the isolation silicon oxide film 20 until a part of the surface of the silicon substrate 1 is exposed through the contact hole. A chemical vapor deposition is subsequently carried out to deposit a polysilicon film 23 having a thickness of 400 nanometers on a top surface of the silicon oxide film 22 thereby the contact hole is filed with the polysilicon. The polysilicon film 23 is subjected to an introduction of phosphorus by use of diffusion. A silicon oxide film 24 having a thickness of 20 nanometers is deposited on a top surface of the phosphorus-doped polysilicon by use of a chemical vapor deposition. The polysilicon film 23 and the silicon oxide film 24 are then defined by lithography and etching processes thereby the remaining part of the polysilicon film serves as a bottom electrode 23. Hemispherical grains 25 of silicon are formed by use of a chemical vapor deposition method and subsequent annealing process if any on a top surface of the silicon oxide film 24, exposed side walls of the polysilicon film 23 and the top surface of the oxide silicon film 22.

With reference to FIG. 1B, the silicon oxide film 24 is subjected to a dry etching using the hemispherical grains 25 as masks so that the silicon oxide film 24 partially remains only under the hemispherical grains 25.

With reference to FIG. 1C, the polysilicon film 23 serving as the bottom electrode is subjected to a dry etching using the remaining silicon oxide film 24 as a mask to form trench grooves 5 under apertures of the remaining silicon oxide film 24 so that the bottom electrode has alternate trench grooves and trench pillars.

Although illustration is omitted, the silicon oxide films 24 and 22 are etched by use of fluorate. A dielectric film is formed along a surface of the bottom electrode with the trench grooves and the trench pillars. A polysilicon film is deposited on the dielectric film for an introduction of phosphorus and subsequent lithography and etching processes to define a top electrode of the polysilicon film. This results in a completion of the formation of the micro-trench storage capacitor.

The micro-trench structure comprising the alternate trench pillars and trench grooves enlarges the contact surface between the dielectric film and either of the top and bottom electrodes. Namely, the micro-trench structure comprising the alternate trench pillars and trench grooves allows the storage capacitor to have a sufficiently large capacity and a small occupied area for implemention in a high integration of the storage capacitors.

The above conventional fabrication methods for the micro-trench storage capacitors is, however, engaged with problems as the hemispherical grains were used as mask to form the micro-trench grooves. It is difficult to control the grain size which defines the size of the micro-trench pillars and apertures. To grow the grain, a clean surface of the silicon is also required, although it is difficult to keep the required clean surface of the silicon. It is further required to keep a clean atmosphere in a chamber involved in the heat treatment system, although it is difficult to keep the required clean atmosphere. Those result in a lowering of an efficiency in manufacturing of the storage capacitors.

Another conventional fabrication method for a storage capacitor is disclosed in the Japanese patent publication No. 1-119049 in which two imcompatible materials are applied on a substrate for removal of one of them and subsequent anisotropic etching process using the other one of the materials as a mask to form grooves in a bottom electrode involved in the storage capacitor.

This conventional fabrication method is also engaged with problems as described below. Since the two different materials are applied on the substrate, the resultant films prepared by application of the materials has a relatively large variation in the thickness. Particularly, when the thickness of the film is made so thin as to form an irregularity of not less than 100 nanometers, a variation in the thickness of the film is enlarged thereby resulting in a serious problem in fabricating the storage capacitor.

It is therefore required to develop a novel fabrication method for the required storage capacitor without the use of any growth of crystal grain or application of the material for the mask on the substrate.

SUMMARY OF THE INVENTION

Accordingly, it is a primary object of the present invention to provide a novel method for fabricating a storage capacitor having a large capacity and a small occupied area.

It is a further object of the present invention to provide a novel method for fabricating a storage capacitor, which is free from any problems as described above.

It is a further more object of the present invention to provide a novel method of fabricating a storage capacitor with micro-trench pillars and grooves in opposite electrodes.

The above and other objects, features and advantages of the present invention will be apparent form the following descriptions.

The invention provides a novel method of fabricating a storage capacitor with micro-trench pillars and grooves in which an insulating film is formed on a semiconductor substrate 1. A bottom conductive film such as a polysilicon film is formed on the insulating film. A phase splitting glass film is formed on the bottom conductive film. The phase splitting glass film is subjected to a heat treatment to be isolated into at least different two glass films. At least one of the different two glass films is removed so that the remaining glass film serves as a mask to be used for a formation of trench grooves within the bottom conductive film 3 thereby a bottom electrode with the micro-trench pillars and grooves are formed. A dielectric film is formed on the trench pillars and trench grooves in the bottom electrode. A top conductive film is formed on the dielectric film so that a top electrode with the trench pillars and trench grooves is formed on the dielectric film. This results in a completion of the formation of the storage capacitor with the trench pillars and grooves.

BRIEF DESCRIPTION OF THE DRAWINGS

Preferred embodiments of the present invention will hereinafter fully be described in detail with reference to the accompanying drawings.

EMBODIMENTS OF THE INVENTION

A first embodiment according to the present invention will be described in detail with reference to FIGS. 2A to 2C in which a micro-trench storage capacitor is fabricated by a novel fabrication method.

Figure 1A:
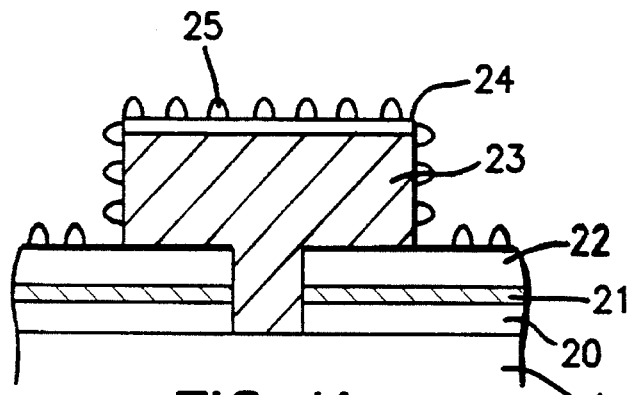
FIGS. 1A to 1C are cross sectional elevation views illustrative of a micro-trench storage capacitor in sequential fabrication steps involved in the conventional fabrication method.
Figure 1B:
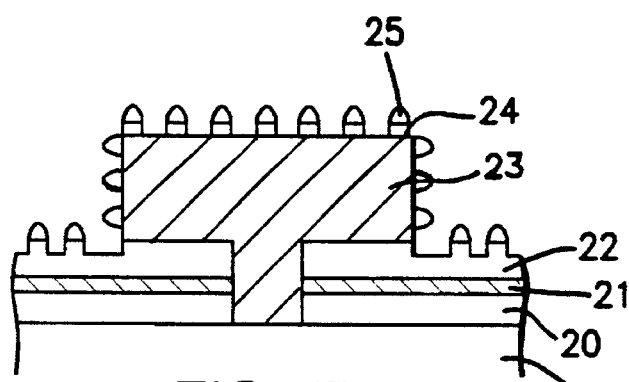
Figure 1C:
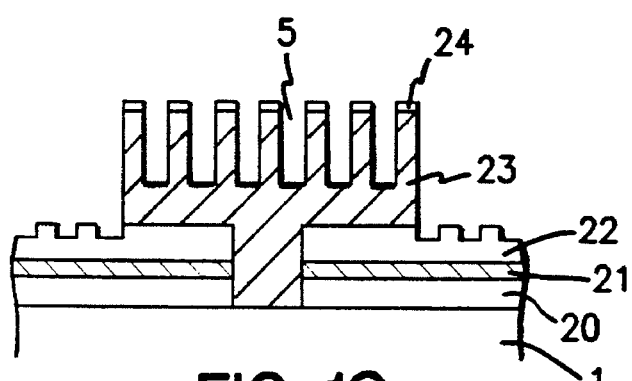
Figure 2A:
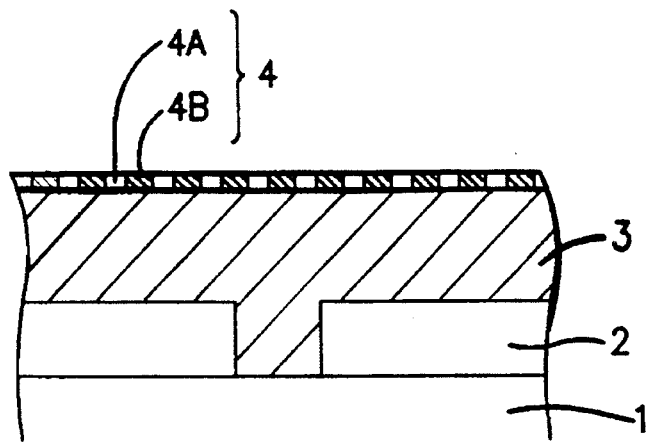
FIGS. 2A to 2C are cross sectional elevation views illustrative of a micro-trench storage capacitor in sequential fabrication steps involved in a novel fabrication method of first and second embodiments according to the present invention.

With reference to FIG. 2A, an isolation film 2 is formed on a silicon substrate 1. A contact hole is formed in the isolation film 2 by use of lithography and etching processes. A polysilicon film 3 having a thickness of 400 nanometers is deposited on a top surface of the isolation film 2 and also within the contact hole so that the polysilicon is in contact with a part of the surface of the silicon substrate 1. The polysilicon film 3 is subsequently introduced with phosphorus by diffusion. A phase splitting glass film 4 having a thickness of 50 nanometers is deposited by use of a chemical vapor deposition at a temperature of 400° C. in which a source gas system comprising $SiH_4, B_2H_6$ and $O_2$ etc. is used. The phase splitting glass film 4 comprises base components of $B_2O_3$-$SiO_2$ system in which the component $SiO_2$ is in the range of from 60 to 80 mol %. The use of the chemical vapor deposition allows the thickness of the phase splitting glass to have a uniformity. The phase splitting glass film 4 is subsequently subjected to an annealing at a temperature of 700° C. for 30 to 60 minutes so to allow the phase splitting glass film 4 to show a spinordal phase splitting thereby the phase splitting glass film 4 is phase-split into a first $SiO_2$ rich glass film 4A and a second $B_2O_3$ rich glass film 4B.

Figure 3:
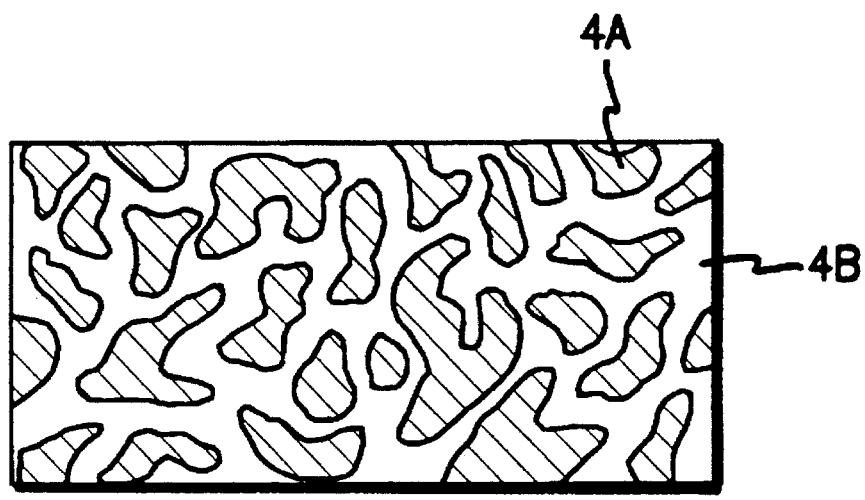
FIG. 3 is a fragmentary plane view illustrative of a phase splitting glass film used in a fabrication process involved in a novel fabrication method for a micro-trench storage capacitor according to the present invention.

It has been known in the art that when a glass comprising a plurality of components was subjected to an annealing at a temperature below the liquidus line, the glass shows a phase splitting into two different phases between which components thereof are different. In a thick phase splitting glass, the phase splitting boundary has three dimensional structure, while a thin phase splitting glass, the phase splitting boundary has two dimensional structure. The phase split boundary between the first and second glass films 4A and 4B shows a two dimensional structure as illustrated in FIG. 3. The different two first and second glass films 4A and 4B have different etching rates to an etchant such as a sulfuric acid. For example, the $B_2O_3$ rich glass material has a higher etching rate than that of the $SiO_2$ rich glass material.

The phase splitting glass film 4 comprising the first and second glass films 4A and 4B is then exposed to an etchant such as a sulfuric acid so that the second glass film 4B made of $B_2O_3$ rich glass is etched, while the first glass film 4A made of $SiO_2$ rich glass remains thereby a fine mask pattern comprising the first $SiO_2$ rich glass film 4A is formed.

Figure 2B:
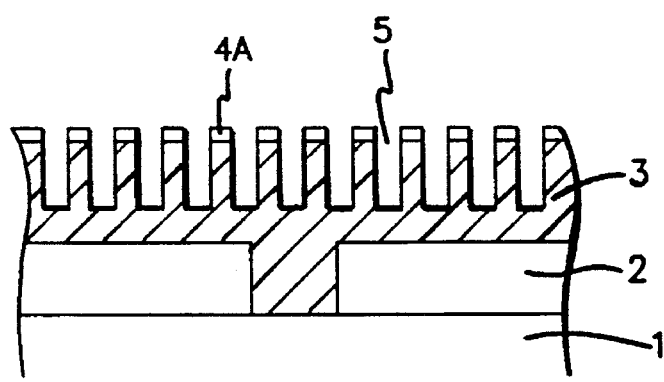

With reference to FIG. 2B, the remaining first glass film 4A is used as a mask pattern for an anisotropic dry etching of the polysilicon film 3 to form micro-trench grooves 5 within the polysilicon film 3 under apertures of the mask thereby micro-trench pillars are defined by the trench grooves 5. It is preferable that each of the trench grooves 5 formed in the polusilicon film 3 has a width in the range of from 30 to 60 nanometers, although the width of the trench grooves is controllable in the range of from 10 to 100 nanometers by controlling components of the phase splitting glass film 4, the thickness thereof and a temperature and a time of the annealing process. The width of the trench grooves may further be enlarged by use of an isotropic etching as required. The trench grooves have a depth of 300 nanometers, although the depth of the trench grooves is controllable by controlling a time of the dry etching process for the formation of the trench groove.

Figure 2C:
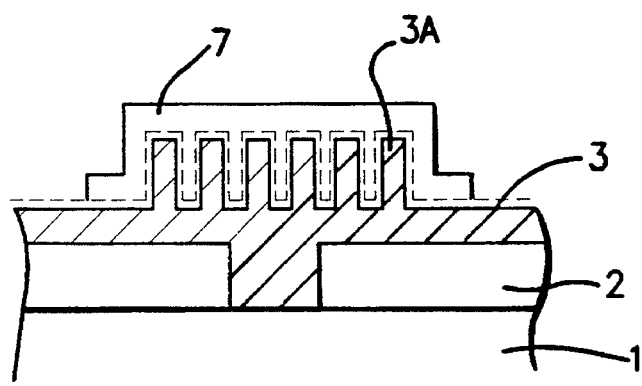

With reference to FIG. 2C, the first glass film 4A which has served as the mask is removed. The polysilicon films 3 having the micro-trench grooves 5 and pillars are defined by use of lithography and etching processes to form a bottom electrode 3A with a micro-trench grove and pillar structure. The above definition process may be carried out before the formation of the micro-trench. A dielectric film 6 having a thickness of 5 to 8 nanometers is deposited on a surface of the micro-trench structure of the bottom electrode 3A by use of a chemical vapor deposition. A polysilicon film having a thickness of 150 nanometers is deposited on a surface of the dielectric film 6 by use of a chemical vapor deposition. Phosphorus is introduced into the polysilicon film by diffusion. The polysilicon film is defined by use of lithography and etching processes to form a top electrode 7 having the micro-trench structure thereby the fabrication of the storage capacitor having the micro-trench structure was complete.

Although in the above embodiment, the second glass film 4B is removed by etching process using the etchant before the trench grooves are formed by the dry etching process, it is possible to carry out the dry etching process to form the trench grooves by use of the phase splitting glass film 4 so that the second glass film 4B only is removed by the dry etching for a formation of a mask pattern comprising the remaining first glass film 4A and subsequent formation of the trench grooves by use of the mask pattern.

Although in the above embodiment, the phosphorus is introduced into the polysilicon films by the diffusion, the phosphorus may be introduced into the polysilicon films in deposition process thereof.

Although in the above embodiment, the phase split glass of the main components of $B_2O_3$-$SiO_2$ system is used, other phase split glass materials such as $P_2O_5$-$B_2O_3$-$SiO_2$ system are available, provided that the phase split glass material shows a phase split into at least two different glass materials which have different etching rates to an etchant as well as the phase split glass material may be deposited by the chemical vapor deposition.

Although in the above embodiment, a phase split glass was used, which shows a spinordal phase split, a phase split glass which shows a nucleation and subsequent growth is also available.

Although in the above embodiment, the phase split glass was deposited by use of the chemical vapor deposition, a sputtering is also available to form the phase split glass film.

A second embodiment according to the present invention will be described in detail with reference to FIGS. 2A to 2C in which a micro-trench storage capacitor is fabricated by a novel fabrication method.

With reference to FIG. 2A, an isolation form 2 is formed on a silicon substrate 1. A contact hole is formed in the isolation film 2 by use of lithography and etching processes. A polysilicon film 3 having a thickness of 400 nanometers is deposited on a top surface of the isolation form 2 and also within the contact hole so that the polysilicon is in contact with a part of the surface of the silicon substrate 1. The polysilicon film 3 is subsequently introduced with phosphorus by diffusion. After the formation of the polysilicon film 3, a phase split glass film made of $P_2O_5$-$B_2O_3$-$SiO_2$ system glass materials having a thickness of 50 nanometers is formed on the top flat surface of the polysilicon film by a sputtering in an argon atmosphere of 12 mTorr wherein a magnetron spluttering system is used. The phase split glass film is subsequently subjected to a heat treatment at a temperature of 680° C. for 30 to 60 minutes so that the phase split glass film shows a phase splitting into different two glass films in which one is a $SiO_2$ rich glass film and the another is a $P_2O_5$-$B_2O_3$ rich glass film. The phase split glass film is then exposed to an etchant such as a sulfuric acid to remove the $P_2O_5$-$B_2O_3$ rich glass film only, while the $SiO_2$ rich glass film remains to serves as a mask for subsequent anisotropic dry etching process to form micro-trench grooves in the polysilicon film which will be defined to serve as a bottom electrode. This sputtering process allows use of more various glass materials as a phase split glass film.

With reference to FIG. 2B, the remaining $SiO_2$ rich glass film is used as a mask pattern for an anisotropic dry etching of the polysilicon film 3 to form micro-trench grooves 5 within the polysilicon film 3 under apertures of the mask thereby micro-trench pillars are defined by the trench grooves 5.

With reference to FIG. 2C, the $SiO_2$ rich glass film which has served as the mask is removed. The polysilicon films 3 having the micro-trench grooves 5 and pillars are defined by use of lithography and etching processes to form a bottom electrode 3A with a micro-trench groove and pillar structure. The above definition process may be carried out before the formation of the micro-trench. A dielectric film 6 having a thickness of 5 to 8 nanometers is deposited on a surface of the micro-trench structure of the bottom electrode 3A by use of a chemical vapor deposition. A polysilicon film having a thickness of 150 nanometers is deposited on a surface of the dielectric film 6 by use of a chemical vapor deposition. Phosphorus is introduced into the polysilicon film by diffusion. The polysilicon film is defined by use of lithography and etching processes to form a top electrode 7 having the micro-trench structure thereby the fabrication of the storage capacitor having the micro-trench structure was completed.

The present invention is applicable to the formation of the flash memory cell involving paired control gate and floating gate electrodes, both of which may be regarded as a capacitor.

Figure 4:
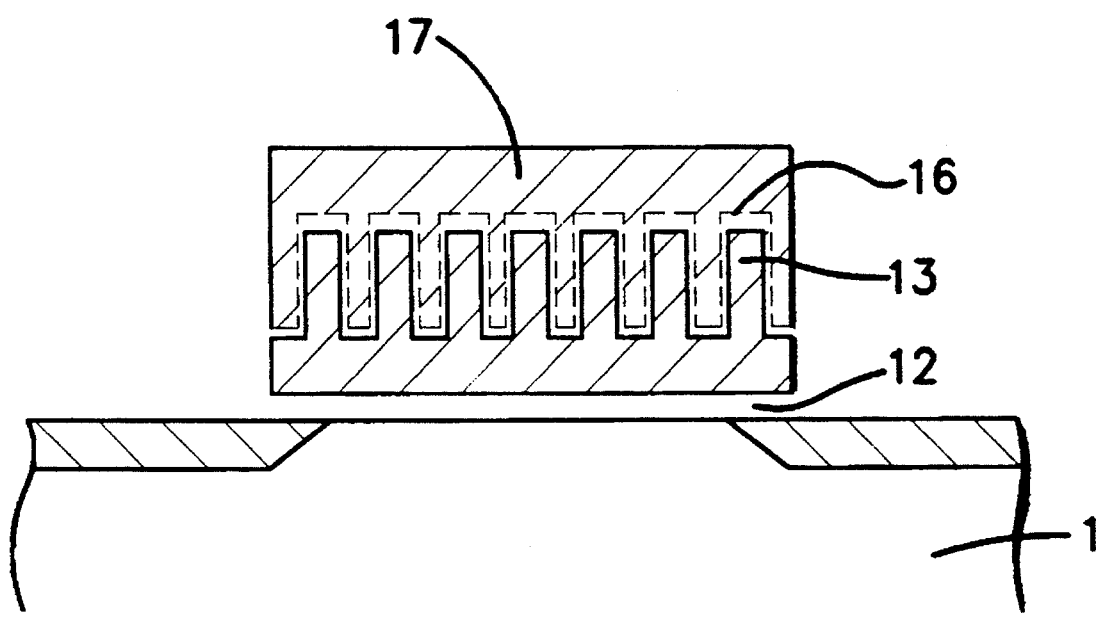
FIG. 4 is a fragmentary cross sectional elevation view illustrative of a floating gate field effect transistor involved in flash memory cells fabricated by a novel method in a third embodiment according to the present invention.

A third embodiment according to the present invention will be described with reference to FIG. 4. The flash memory cell has a control gate electrode 17 and a floating gate electrode 13, both of which are electrically isolated through a dielectric film. This gate structure involved in the flash memory cell constitutes such a capacitor as a micro-trench storage capacitor.

After a formation of a gate oxide film 12 on a semiconductor substrate 1, a polysilicon film is deposited on a top surface of the gate oxide film 12. The polysilicon film is subsequently introduced with phosphorus by diffusion. A phase splitting glass film is deposited by use of a chemical vapor deposition. The phase splitting glass film may comprise base components of $B_2O_3$-$SiO_2$ system in which the component $SiO_2$ is in the range of from 60 to 80 mol %. The use of the chemical vapor deposition allows the thickness of the phase splitting glass to be uniform. The phase splitting glass film is subsequently subjected to an annealing at a temperature of 700° C. for 30 to 60 minutes so to allow the phase splitting glass film to show a spinordal phase splitting thereby the phase splitting glass film is phase-split into a first $SiO_2$ rich glass film and a second $B_2O_3$ rich glass film. The $B_2O_3$ rich glass material has a higher etching rate than that of the $SiO_2$ rich glass material.

The phase splitting glass film comprising the first and second glass films is the exposed to an etchant such as a sulfuric acid so that the second glass film made of $B_2O_3$ rich glass is etched, while the first glass film made of $SiO_2$ rich glass remains thereby a fine mask pattern comprising the first $SiO_2$ rich glass film is formed.

The remaining first glass film is used as a mask pattern for an anisotropic dry etching of the polysilicon film 3 to form micro-trench grooves within the polysilicon film under apertures of the mask thereby micro-trench pillars are defined by the trench grooves. The width of the trench grooves may further be enlarged by use of an isotropic etching as required. The trench grooves have a depth of 300 nanometers, although the depth of the trench grooves is controllable by controlling a time of the dry etching process for the formation of the trench groove.

The first glass film which has served as the mask is removed. The polysilicon films having the micro-trench grooves and pillars are defined by use of lithography and etching processes to form a floating gate electrode 13 with a micro-trench groove and pillar structure. The above definition process may be carried out before the formation of the micro-trench. A dielectric film 16 having a thickness of 5 to 8 nanometers is deposited on a surface of the micro-trench structure of the bottom electrode by use of a chemical vapor deposition. A polysilicon film having a thickness of 150 nanometers is deposited on a surface of the dielectric film 16 by use of a chemical vapor deposition. Phosphorus is introduced into the polysilicon film by diffusion. The polysilicon film is defined by use of lithography and etching processes to form a control gate electrode 17 having the micro-trench structure thereby the fabrication of the storage capacitor having the micro-trench structure was completed.

Whereas modifications of the present invention will no doubt be apparent to a person having ordinary skill in the art, to which the invention pertains, it is to be understood that the embodiments shown and described by way of illustrations are by no means intended to be considered in a limiting sense. Accordingly, it is to be intended to cover by claims all modifications which fall within the spirit and scope of the invention.

What is claimed is:

1. A method for fabricating a storage capacitor comprising the steps of:

forming a bottom semiconductor film having an electrical conductivity;

depositing a phase splitting glass film on said bottom semiconductor film by a chemical vapor deposition method;

subjecting said phase splitting glass film to a heat treatment to allow said phase splitting glass film to be split into at least two different glass films which have different components;

subjecting said phase splitting glass film to an etching in which one of said at least two different glass films has a higher etching rate than an etching rate of another of said at least two different glass films so that one of said at least two different glass films having the higher etching rate only is removed, while said another of said at least two different glass films remains thereby a mask pattern comprising the remaining another of said at least two different glass films is formed;

subjecting said bottom semiconductor film to a dry etching using said mask pattern to form trench grooves and trench pillars in said bottom semiconductor film;

forming a dielectric film on surfaces of said trench grooves and trench pillars; and forming a top semiconductor film having an electrical conductivity on said dielectric film.

2. The method as claimed in claim 1, wherein said phase splitting glass film comprises $H_2O_3$ and $SiO_2$ as base components.

3. The method as claimed in claim 1, wherein said phase splitting glass film comprises $P_2O_5$, $B_2O_3$ and $SiO_2$ as base components.

4. The method as claimed in claim 1, wherein said phase splitting glass comprises $SiO_2$ in the range from 60 to 80 mol %.

5. The method as claimed in claim 1, wherein said chemical vapor deposition is carried out at a temperature of 400° C.

6. The method as claimed in claim 1, wherein said phase splitting glass film is deposited by sputtering.

7. The method as claimed in claim 1, wherein said heat treatment is carried out at a temperature below a liquidus line.

8. The method as claimed in claim 2, wherein said heat treatment is carried out at a temperature of 700° C. for 30 to 60 minutes.

9. The method as claimed in claim 3, wherein said heat treatment is carried out at a temperature of 680° C. for 30 to 60 minutes.

10. The method as claimed in claim 1, wherein said top and bottom semiconductor films comprise polysilicon.

11. The method as claimed in claim 1, wherein said one of said at least two different glass films is removed by a wet etching.

12. The method as claimed in claim 1, wherein said one of said at least two different glass films is removed by an anisotropic dry etching to form said trench grooves.

13. The method as claimed in claim 1, wherein said trench grooves have a width in the range from 10 to 100 nanometers.

14. A method for fabricating a plurality of trench grooves in a semiconductor film comprising the steps of:

forming a bottom semiconductor film;

depositing a phase splitting glass film on said bottom semiconductor film by a chemical vapor deposition method;

subjecting said phase splitting glass film to a heat treatment to allow said phase splitting glass film to be split into at least two different glass films which have different components;

subjecting said phase splitting glass film to an etching in which one of said at least two different glass films has a higher etching rate than an etching rate of another of said at least two different glass films so that one of said at least two different glass films having the higher etching rate only is removed, while said another of said at least two different glass films remains thereby a mask pattern comprising the remaining another of said at least two different glass films is formed;

subjecting said bottom semiconductor film to a dry etching using said mask pattern to form trench grooves and trench pillars in said bottom semiconductor film; and forming a dielectric film on surfaces of said trench grooves and trench pillars in said bottom semiconductor film.

15. The method as claimed in claim 14, wherein said phase splitting glass film comprises $B_2O_3$ and $SiO_2$ as base components.

16. The method as claimed in claim 14, wherein said phase splitting glass film comprises $P_2O_5$, $B_2O_3$ and $SiO_2$ as base components.

17. The method as claimed in claim 14, wherein said phase splitting glass comprises $SiO_2$ in the range from 60 to 80 mol %.

18. The method as claimed in claim 14, wherein said chemical vapor deposition is carried out at a temperature of 400° C.

19. The method as claimed in claim 14, wherein said phase splitting glass film is deposited by sputtering.

20. The method as claimed in claim 14, wherein said heat treatment is carried out at a temperature below a liquidus line.

21. The method as claimed in claim 15, wherein said heat treatment is carried out at a temperature of 700° C. for 30 to 60 minutes.

22. The method as claimed in claim 16, wherein said heat treatment is carried out at a temperature of 680° C. for 30 to 60 minutes.

23. The method as claimed in claim 14, wherein said bottom semiconductor films comprise polysilicon.

24. The method as claimed in claim 14, wherein said one of said at least two different glass films is removed by a wet etching.

25. The method as claimed in claim 14, wherein said one of said at least two different glass films is removed by an anisotropic dry etching to form said trench grooves.

26. The method as claimed in claim 14, wherein said trench grooves have a width in the range from 10 to 100 nanometers.

* * * * *